United States Patent
Ausserlechner et al.

(10) Patent No.: US 8,839,677 B2
(45) Date of Patent: *Sep. 23, 2014

(54) STRESS SENSING DEVICES AND METHODS

(75) Inventors: Udo Ausserlechner, Villach (AT); Mario Motz, Wernberg (AT)

(73) Assignee: Infineon Technologies AG, Neubiberg (DE)

(*) Notice: Subject to any disclaimer, the term of this patent is extended or adjusted under 35 U.S.C. 154(b) by 30 days.

This patent is subject to a terminal disclaimer.

(21) Appl. No.: 13/556,633

(22) Filed: Jul. 24, 2012

(65) Prior Publication Data

US 2012/0285255 A1 Nov. 15, 2012

Related U.S. Application Data

(63) Continuation of application No. 12/714,605, filed on Mar. 1, 2010, now Pat. No. 8,240,218.

(51) Int. Cl.
*G01B 7/16* (2006.01)
*G01L 1/22* (2006.01)

(52) U.S. Cl.
CPC ............... *G01B 7/18* (2013.01); *G01L 1/2293* (2013.01)
USPC ........................................ 73/777; 73/862.041

(58) Field of Classification Search
USPC ............................. 73/777, 862.041–862.046
See application file for complete search history.

(56) References Cited

U.S. PATENT DOCUMENTS

| | | | |
|---|---|---|---|
| 5,128,823 A * | 7/1992 | Fujimoto et al. | 361/93.9 |
| 5,151,764 A * | 9/1992 | Suzuki et al. | 257/425 |
| 7,045,903 B2 | 5/2006 | Efland | |
| 7,126,168 B1 | 10/2006 | Vashchenko | |
| 7,368,748 B2 | 5/2008 | Lee | |
| 7,477,943 B2 | 1/2009 | Danzl | |
| 7,655,857 B2 | 2/2010 | Yoshino | |
| 8,240,218 B2 * | 8/2012 | Ausserlechner et al. | 73/777 |
| 8,497,459 B2 * | 7/2013 | Solin et al. | 250/208.1 |
| 2006/0148113 A1 | 7/2006 | Jung | |
| 2008/0310061 A1 * | 12/2008 | Jeon et al. | 361/56 |
| 2009/0108839 A1 | 4/2009 | Ausserlechner | |

FOREIGN PATENT DOCUMENTS

| | | |
|---|---|---|
| DE | 101 54 495 A1 | 5/2003 |
| DE | 10 2005 008 724 A1 | 9/2006 |
| DE | 10 2005 008 772 A1 | 9/2006 |
| DE | 102005008724 | 9/2006 |
| DE | 10 2008 051 949 A1 | 5/2009 |
| WO | WO 03/040852 | 5/2003 |

OTHER PUBLICATIONS

Application No. 102011004848.0, German Office Action dated Mar. 1, 2012, 14 pages.
U.S. Appl. No. 12/714,605, filed Mar. 1, 2010, Inventor: Ausserlechner et al.

* cited by examiner

*Primary Examiner* — Max Noori
(74) *Attorney, Agent, or Firm* — Patterson Thuente Pedersen, P.A.

(57) ABSTRACT

Embodiments relate to stress sensors and methods of sensing stress. In an embodiment, a stress sensor comprises a vertical resistor. The vertical resistor can comprise, for example, an n-type resistor and can have various operating modes. The various operating modes can depend on a coupling configuration of terminals of the resistor and can provide varying piezo-coefficients with very similar temperature coefficients of resistances. Comparisons of resistances and piezo-coefficients in differing operating modes can provide a measure of mechanical stresses acting on the device.

20 Claims, 16 Drawing Sheets

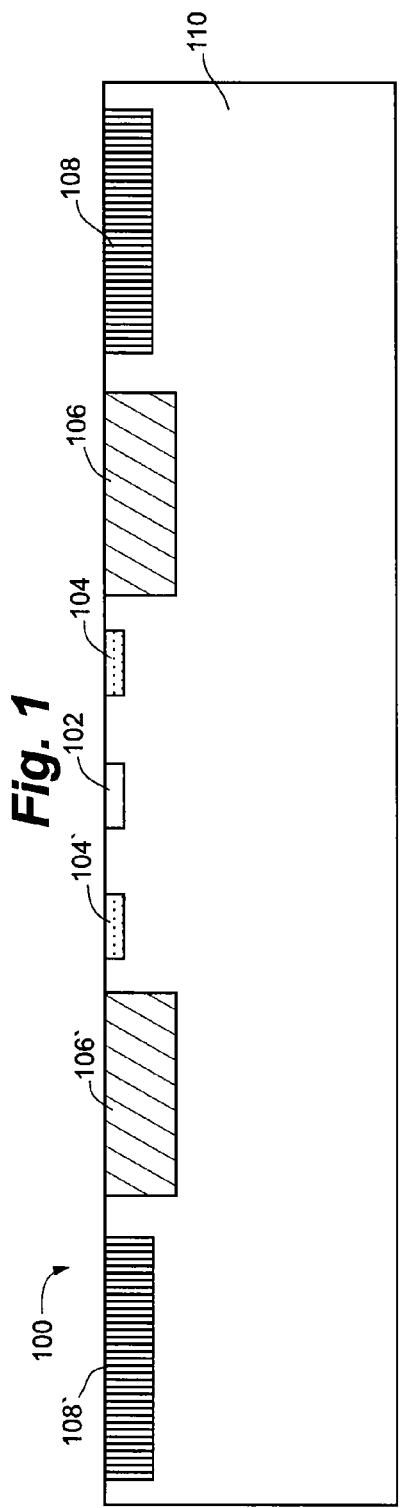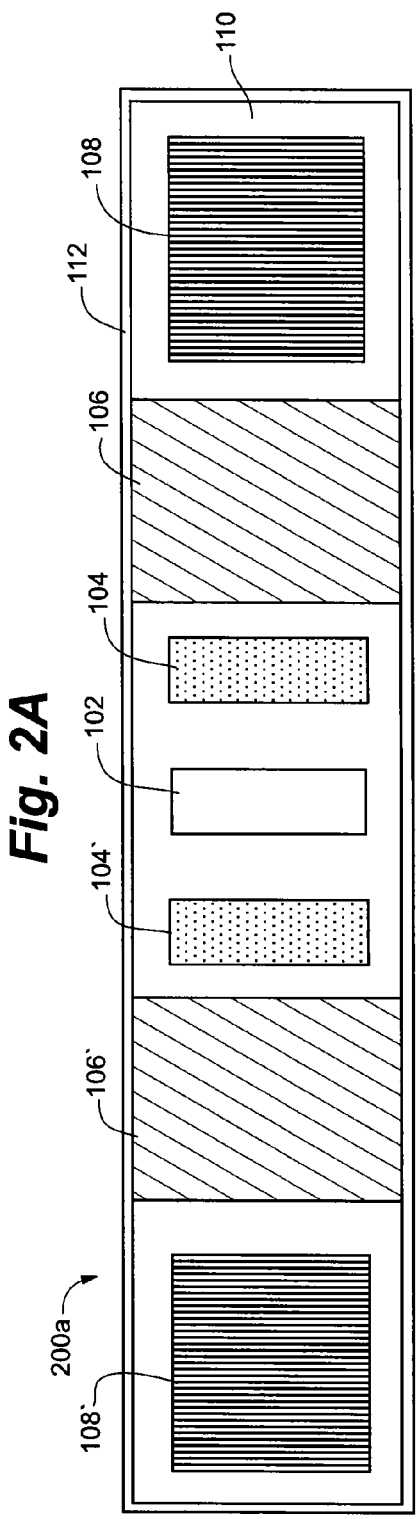

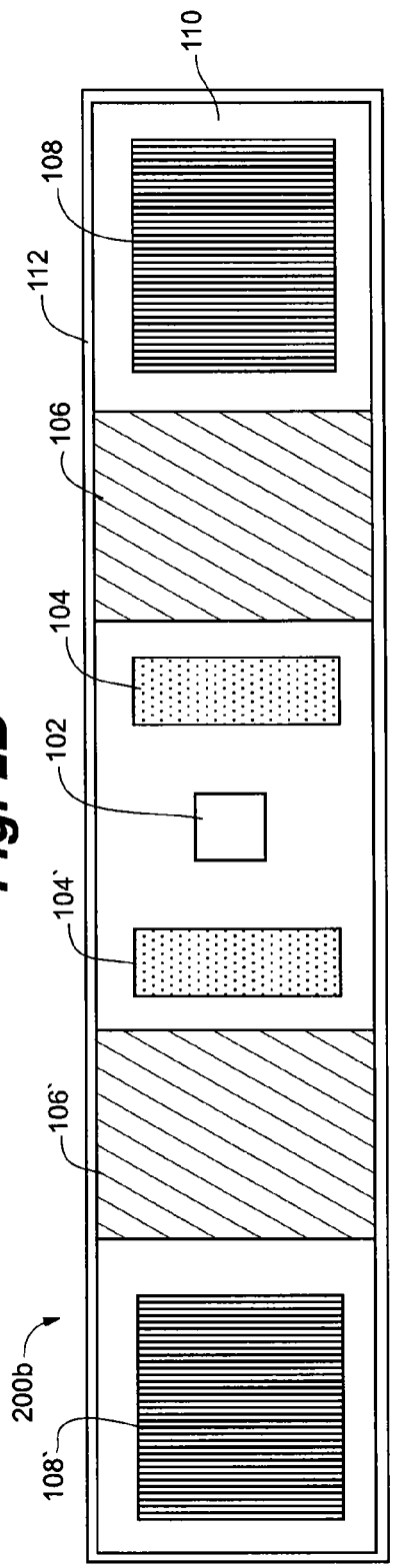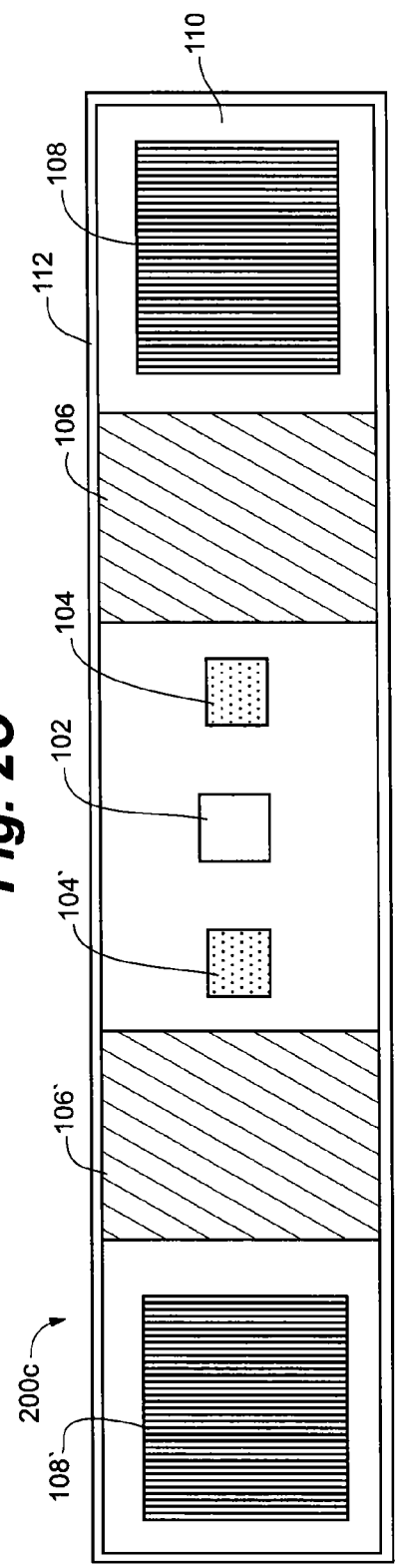

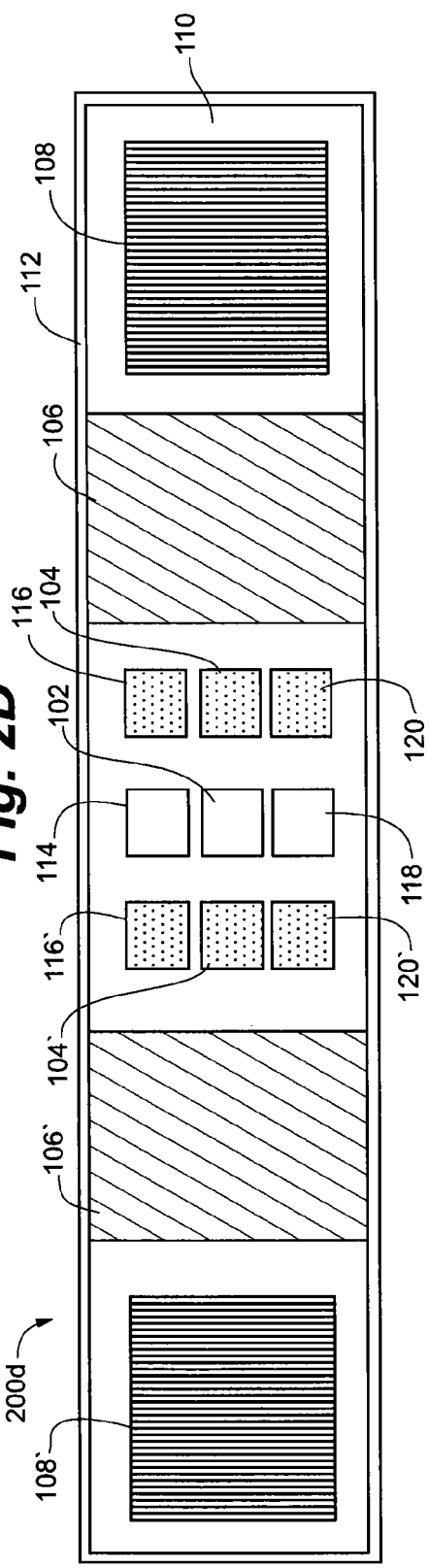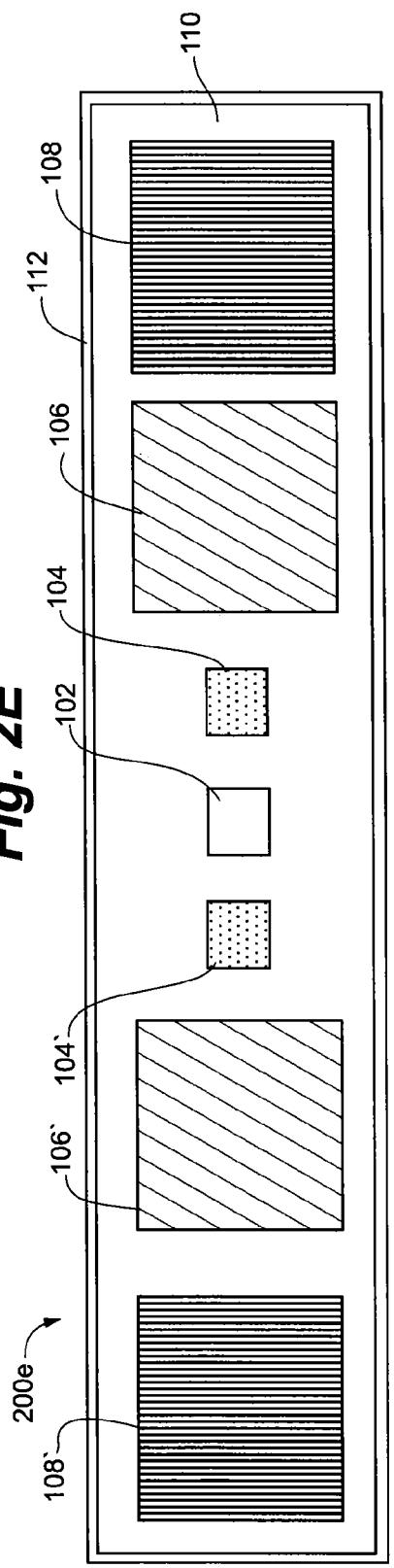

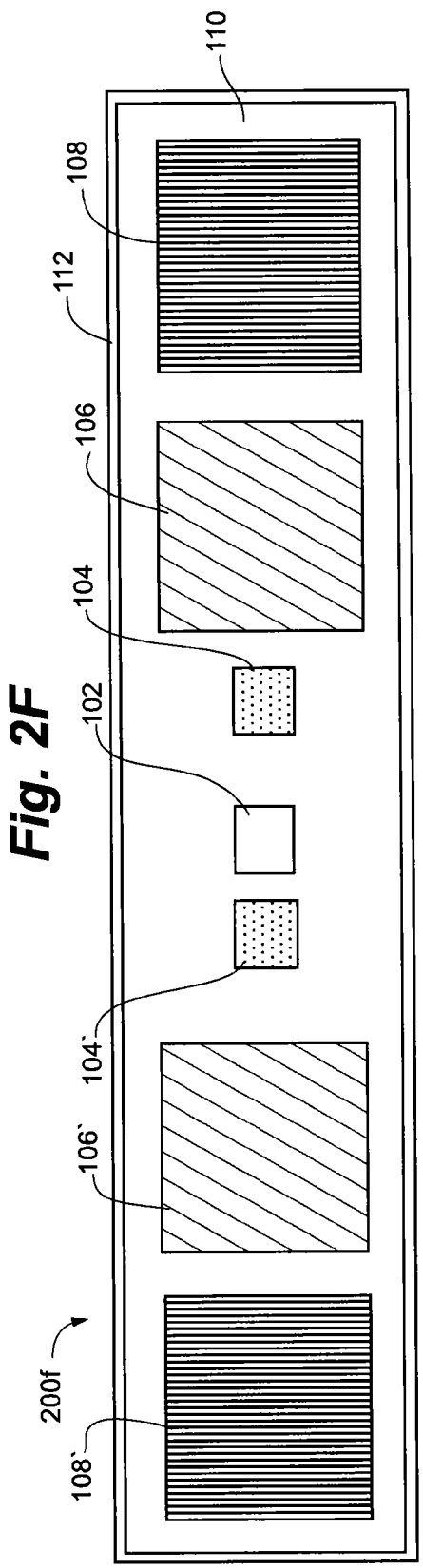

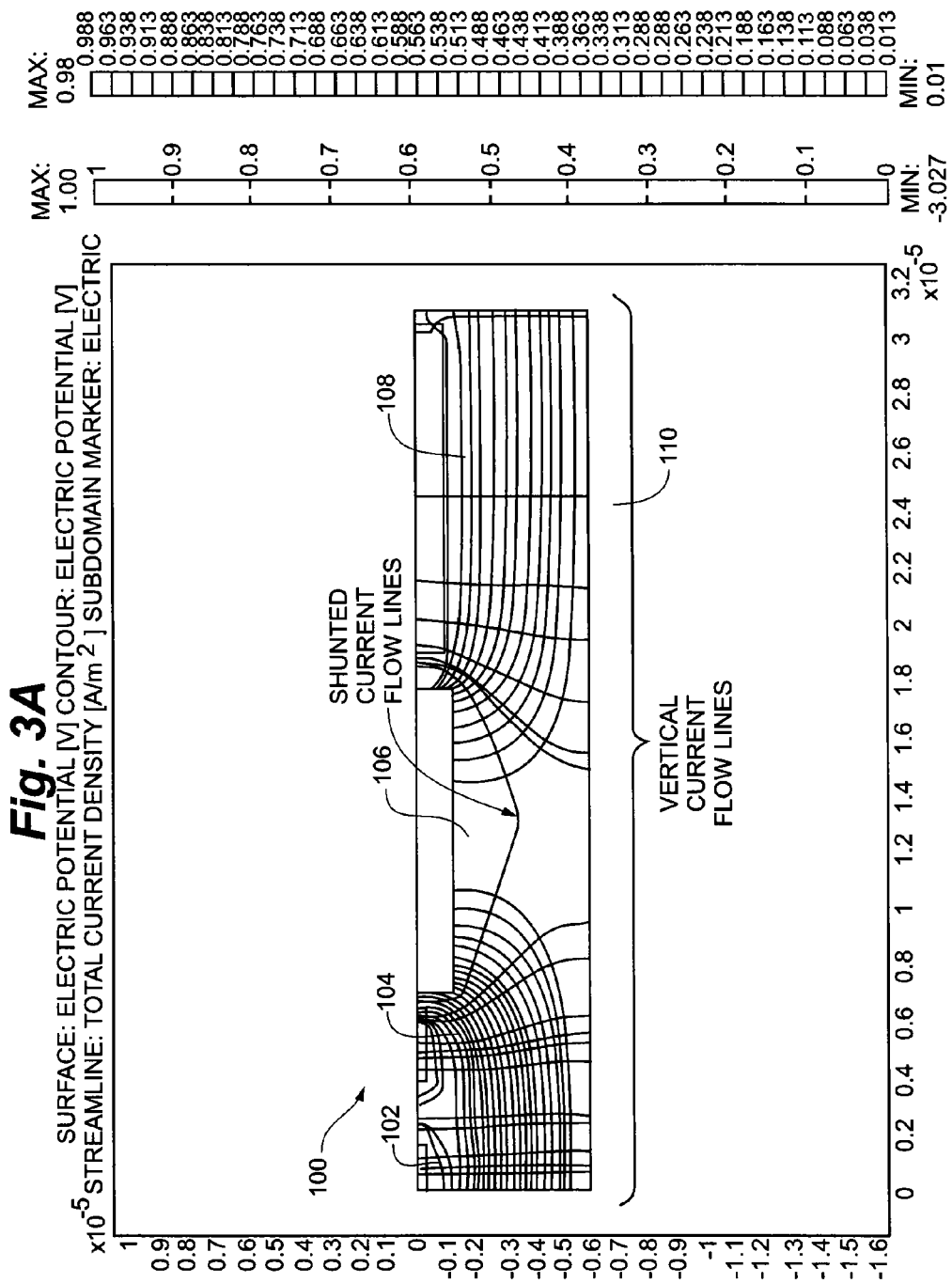

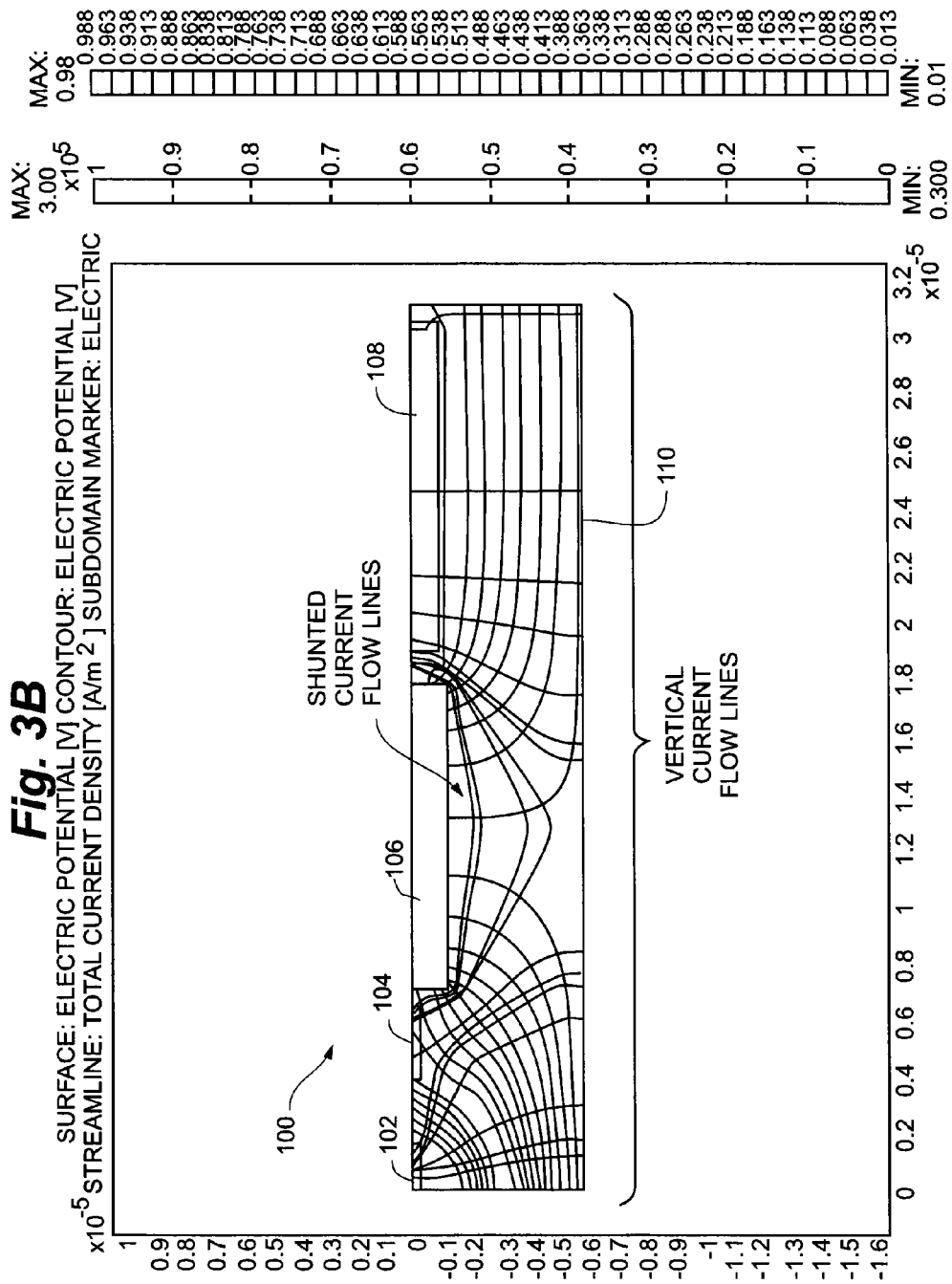

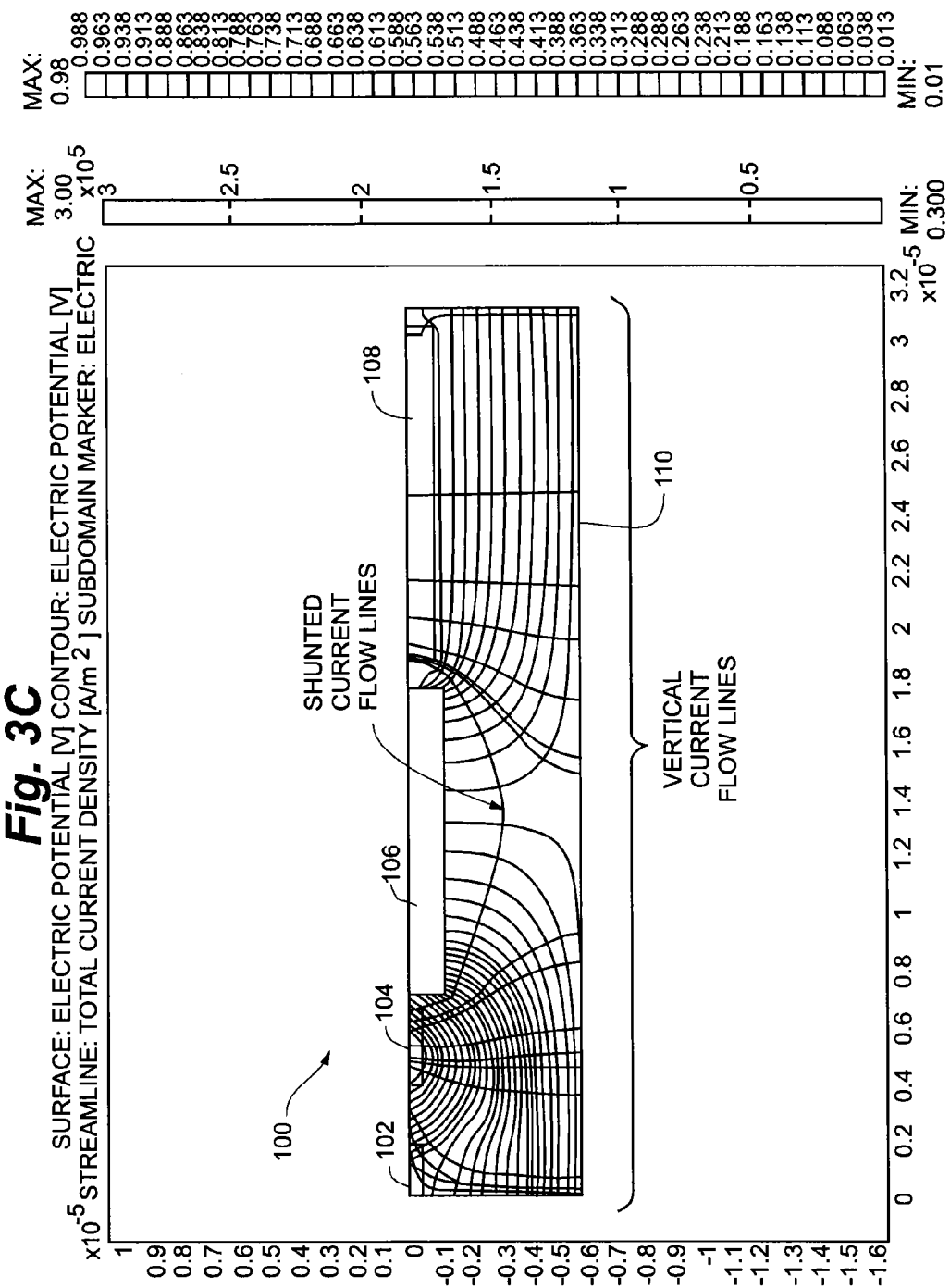

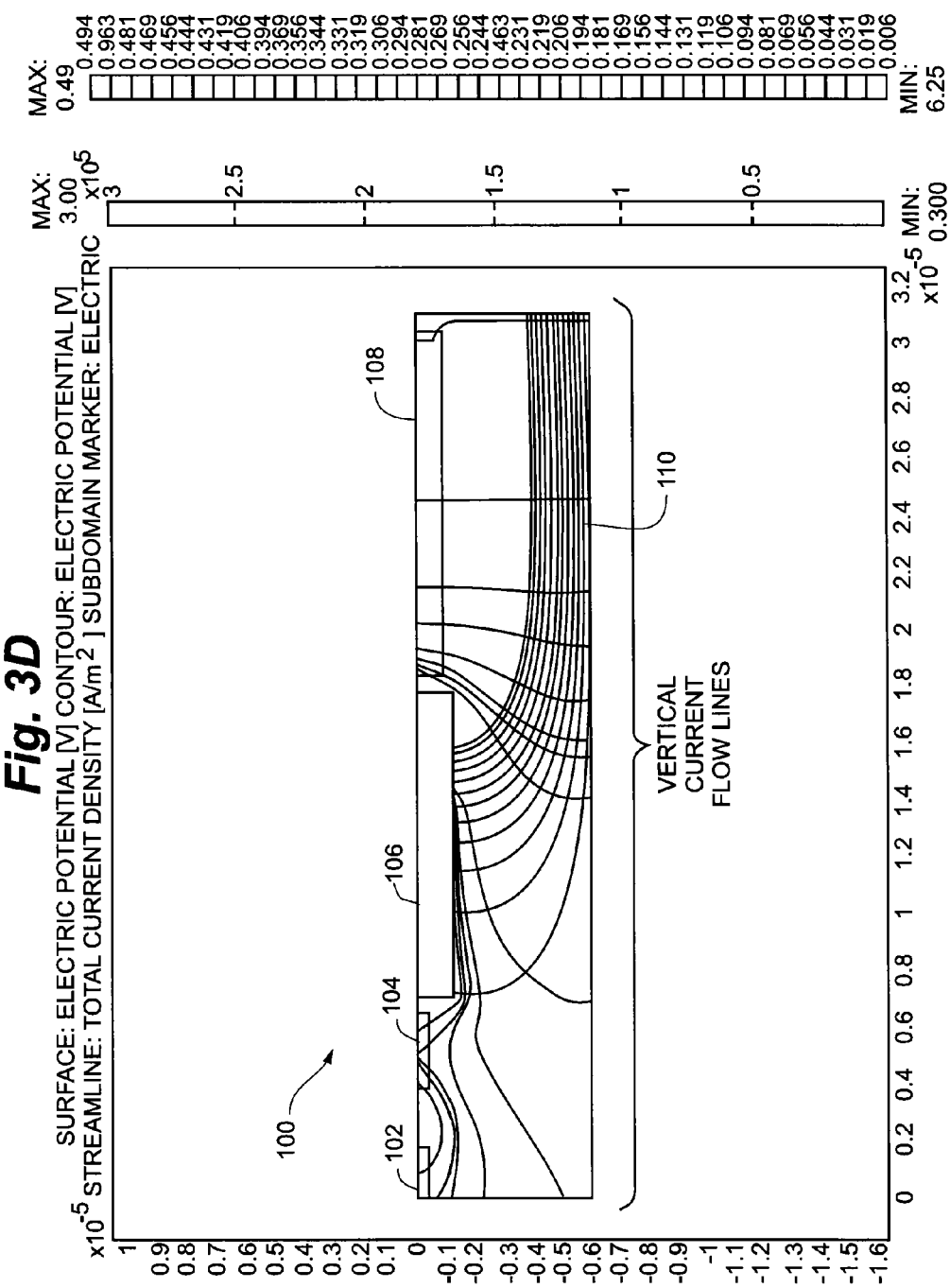

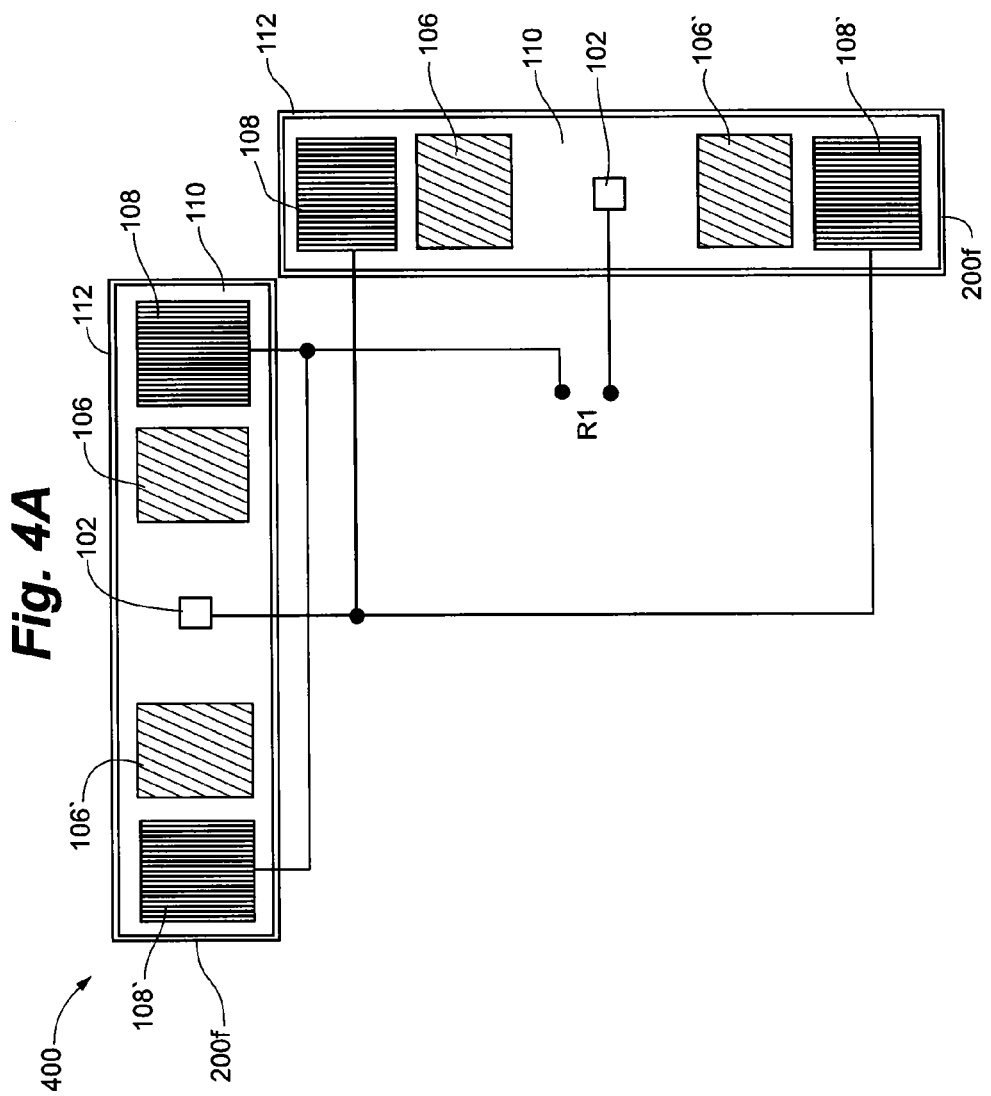

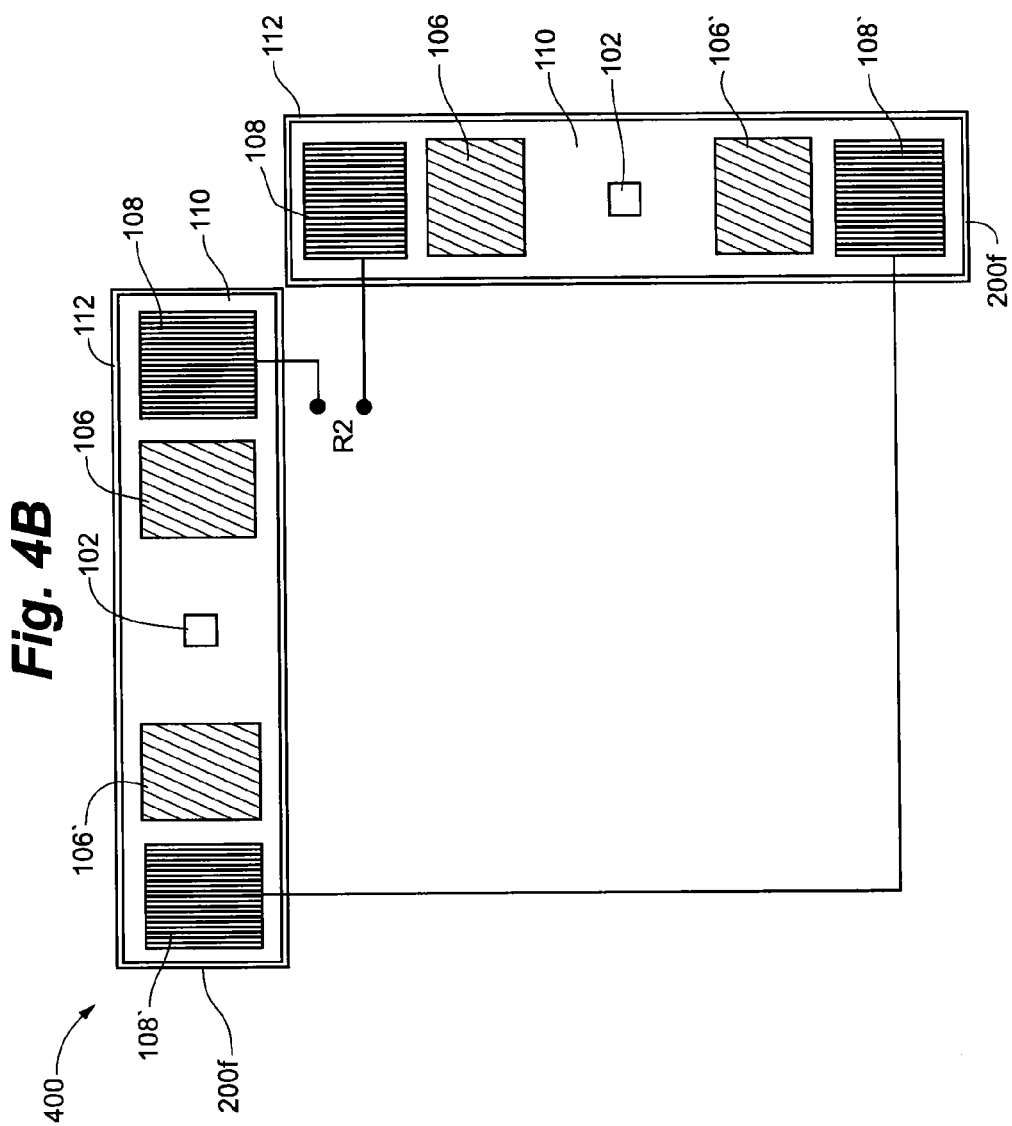

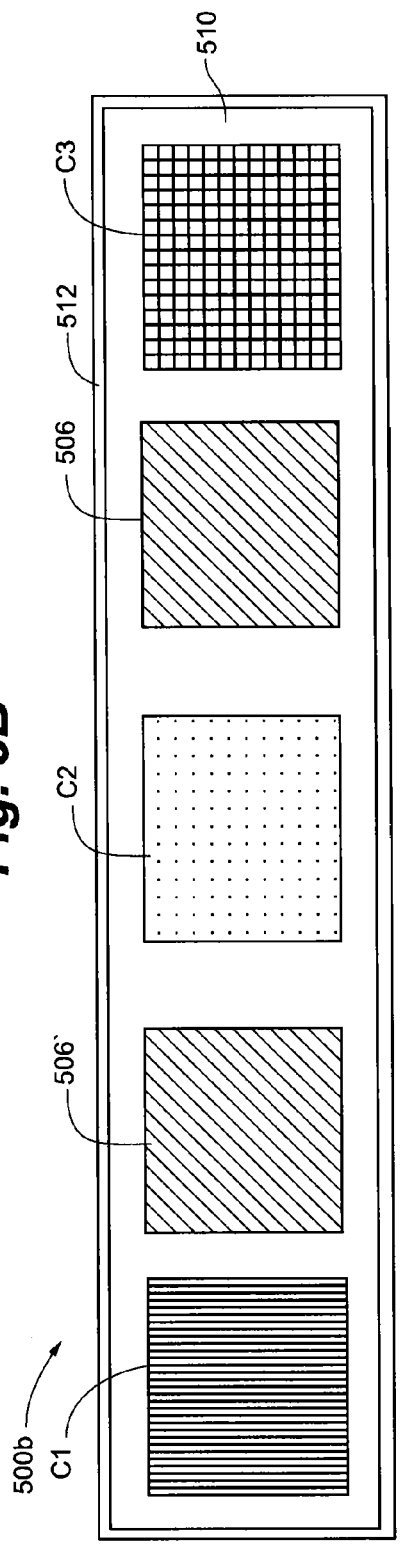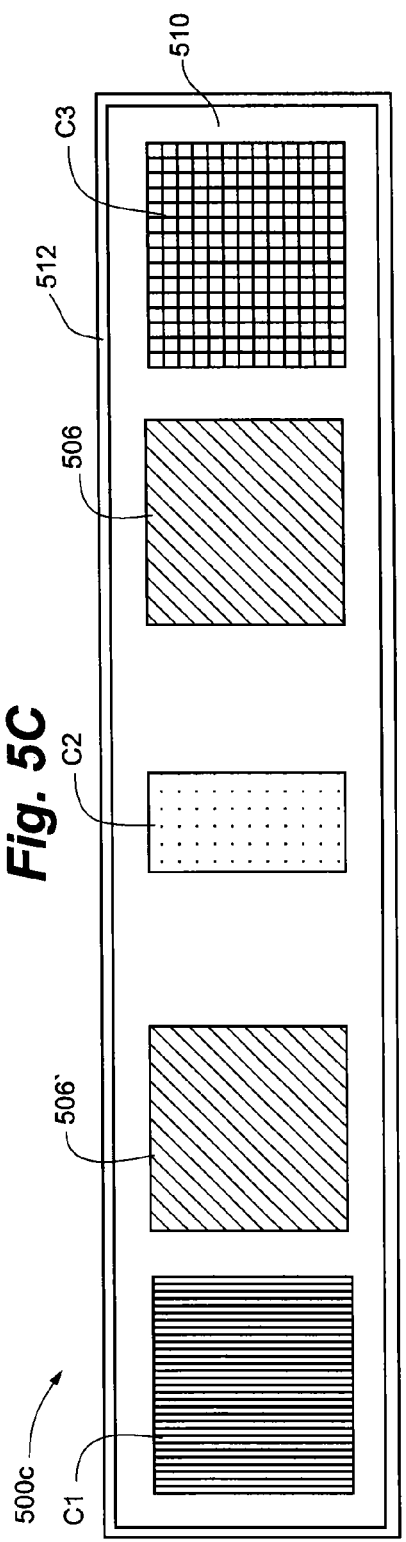

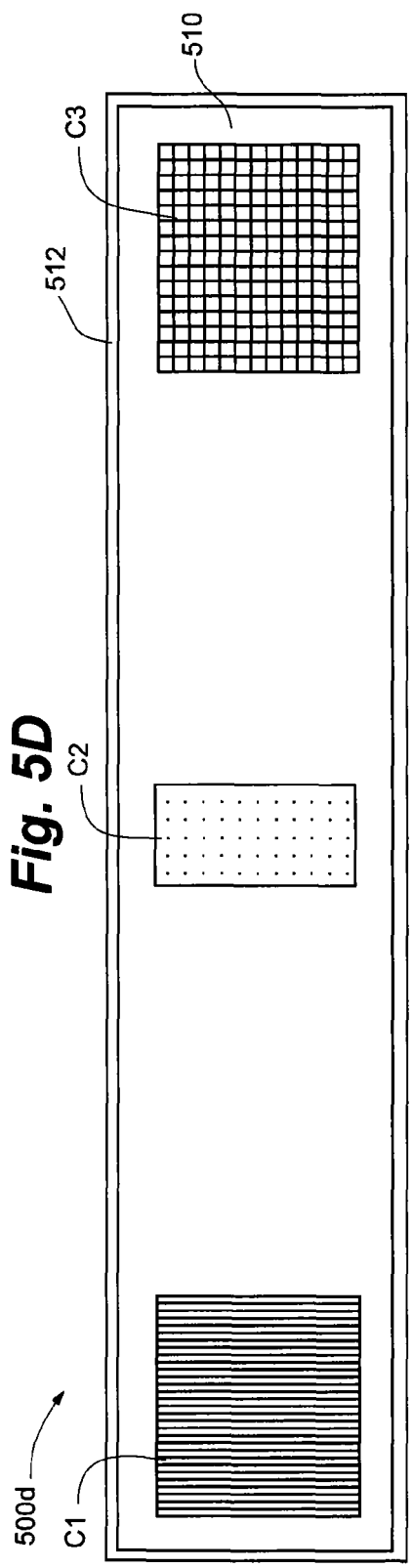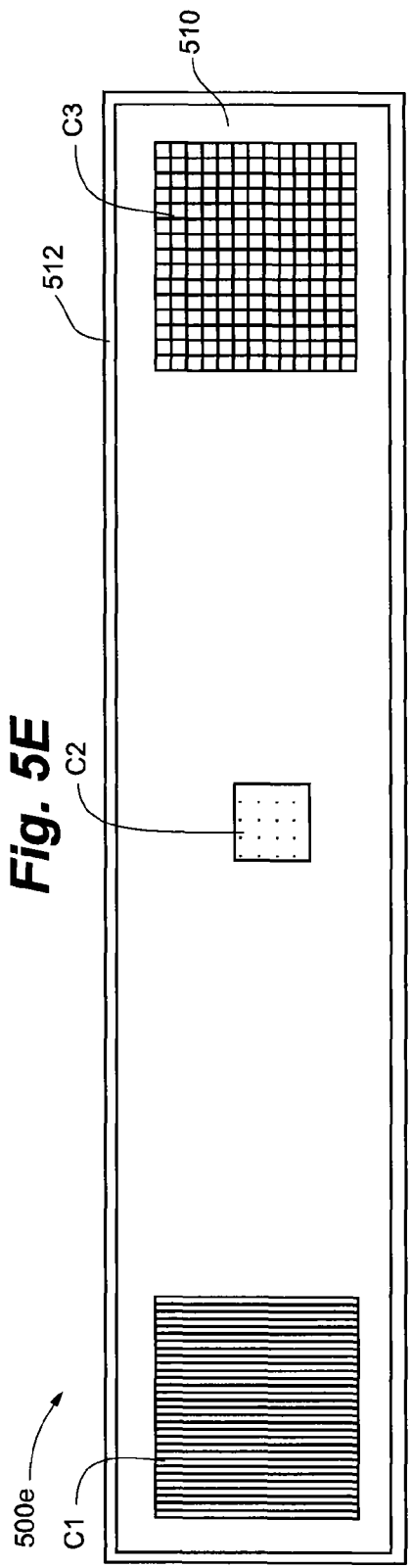

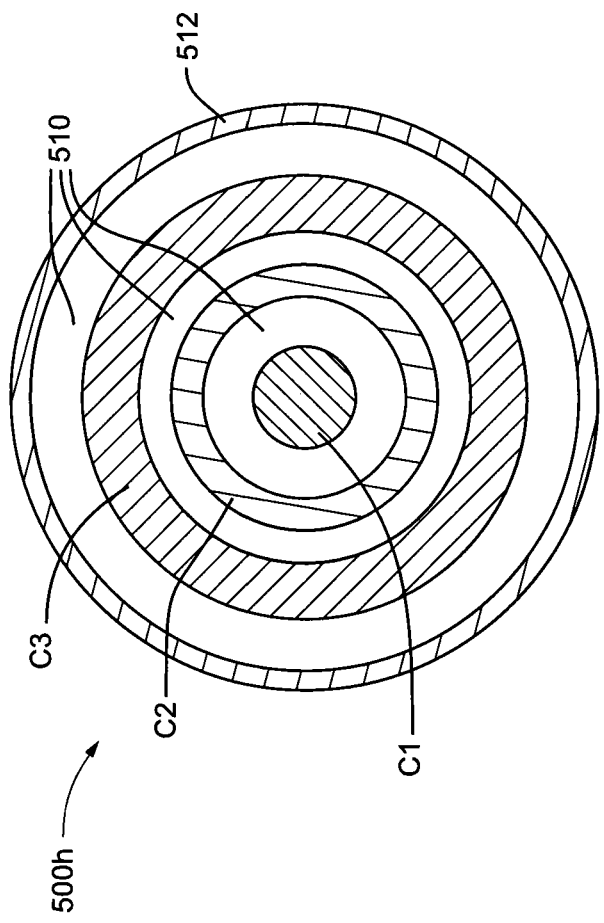

STRESS SENSING DEVICES AND METHODS

RELATED APPLICATION

This application is a continuation of application Ser. No. 12/714,605 filed Mar. 1, 2010, which is incorporated herein by reference in its entirety.

FIELD OF THE INVENTION

The invention relates generally to stress sensing devices and more particularly to integrated circuit mechanical stress sensors utilizing vertical resistors.

BACKGROUND

Mechanical stress changes the electronic parameters of micro-electronic devices. Circuits that depend on these parameters or absolute values thereof, such as Hall sensors, constant current sources and band-gap regulated reference voltages, can suffer from a stress drift. The drift of these circuits can be reduced by measuring the mechanical stress and compensating the resulting drift for this measured stress change.

Stress sensors can be made by comparing two different diffused or implanted resistors, such as a lateral p-type resistor with a lateral n-type resistor or a lateral n-type resistor with a vertical n-type resistor. The former can suffer from different temperature coefficients between p- and n-type resistances. While the latter has much better matching of temperature coefficients, there is still a notable difference in these coefficients between vertical and lateral n-type resistances. In practice, different n-wells for lateral and vertical resistors are typically used in CMOS technology such that the temperature coefficient, which depends on the doping level, is not identical. Additionally, a significant technology spread between different doping levels usually has to be contended with.

SUMMARY

Embodiments relate to stress sensing devices and methods. In an embodiment, a stress sensing device comprises an active semiconductor layer; and a plurality of contacts for the active semiconductor layer, the plurality of contacts spaced apart from one another, wherein the stress sensing device is configured to sense a mechanical stress from vertical components in the active semiconductor layer of currents applied to at least one of the plurality of contacts.

In an embodiment, a stress sensing device comprises an active layer; at least two contacts arranged in a first surface of the active layer; and a buried layer coupled to a second surface of the active layer opposite the first surface, wherein the at least two contacts, the active layer and the buried layer comprise n-elements, and a mechanical stress is related to a portion of a current that flows in the active layer from at least one of the at least two contacts.

In an embodiment, a stress sensing device comprises an active semiconductor region; and at least three contacts for the active semiconductor region, the at least three contacts spaced apart from one another and configured to apply currents with vertical components to flow through the active semiconductor region, wherein the stress sensing device is configured to sense mechanical stress based on the applied currents.

BRIEF DESCRIPTION OF THE DRAWINGS

The invention may be more completely understood in consideration of the following detailed description of various embodiments of the invention in connection with the accompanying drawings, in which:

FIG. 1 depicts a side view cross-sectional block diagram of a stress sensor device according to an embodiment.

FIG. 2A depicts a top view block diagram of a stress sensor device according to an embodiment.

FIG. 2B depicts a top view block diagram of a stress sensor device according to an embodiment.

FIG. 2C depicts a top view block diagram of a stress sensor device according to an embodiment.

FIG. 2D depicts a top view block diagram of a stress sensor device according to an embodiment.

FIG. 2E depicts a top view block diagram of a stress sensor device according to an embodiment.

FIG. 2F depicts a top view block diagram of a stress sensor device according to an embodiment.

FIG. 3A is a side view cross-sectional diagram of current flow in a stress sensor device according to an embodiment.

FIG. 3B is a side view cross-sectional diagram of current flow in a stress sensor device according to an embodiment.

FIG. 3C is a side view cross-sectional diagram of current flow in a stress sensor device according to an embodiment.

FIG. 3D is a side view cross-sectional diagram of current flow in a stress sensor device according to an embodiment.

FIG. 4A depicts a top view block diagram of an L-layout stress sensor device according to an embodiment.

FIG. 4B depicts a top view block diagram of an L-layout stress sensor device according to an embodiment.

FIG. 5B is a top view block diagram of a stress sensor device according to an embodiment.

FIG. 5C is a top view block diagram of a stress sensor device according to an embodiment.

FIG. 5D is a top view block diagram of a stress sensor device according to an embodiment.

FIG. 5E is a top view block diagram of a stress sensor device according to an embodiment.

FIG. 5H is a top view block diagram of a stress sensor device according to an embodiment.

Figure 5A:
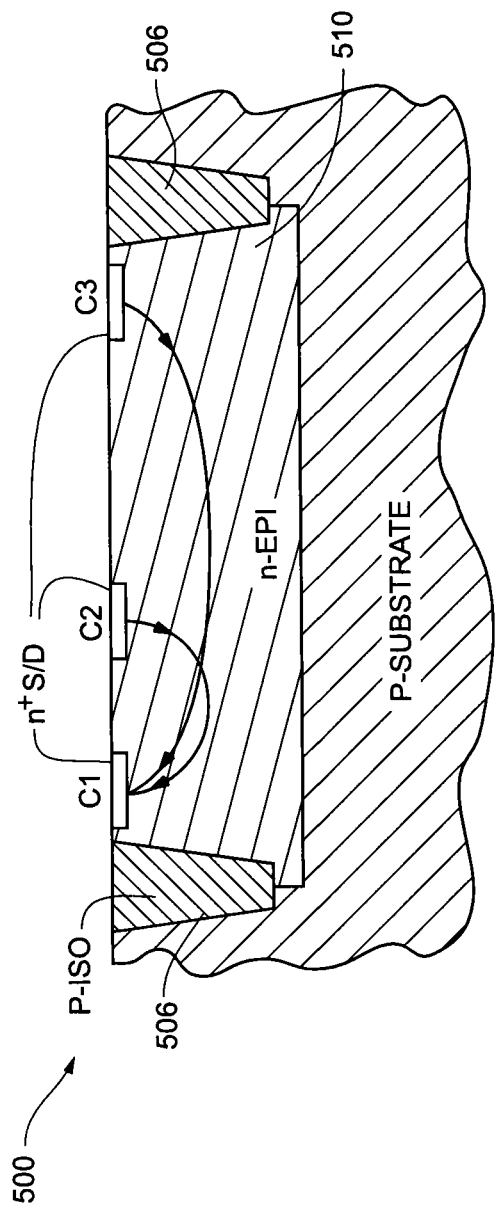
FIG. 5A depicts a side view cross-sectional diagram of a stress sensor device according to an embodiment.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

Embodiments relate to stress sensors and methods of sensing stress. In an embodiment, a stress sensor comprises a vertical resistor. The vertical resistor can comprise, for example, an n-type resistor and can have various operating modes. The various operating modes can depend on a coupling configuration of terminals of the resistor and can provide varying piezo-coefficients with very similar temperature coefficients of resistances. Comparisons of resistances and piezo-coefficients in differing operating modes can provide a measure of mechanical stresses acting on the device.

Referring to FIG. 1, a stress sensor comprising a resistive device 100 is depicted. In an embodiment, device 100 comprises at least three contacts or terminals, providing for operation of device 100 in at least two operating modes having different piezo-coefficients. Because the effective piezo-coefficient of the resistance depends on the operating mode, a comparison of resistance values from different operating modes is a unique measure of the mechanical stress affecting the device 100.

In FIG. 1, device 100 is laterally symmetrical as depicted on the page and comprises five contacts: three center contacts 102, 104 and 104' and two outer contacts 108 and 108'. The contacts 102, 104, 104', 108 and 108' are formed in an epitaxial layer 110 with the center contacts 102, 104 and 104' separated from the outer contacts 108 and 108' by two isolation regions 106 and 106'. In an embodiment, device 100 comprises an n-buried layer below epitaxial layer 110, which itself is a low n-doped region, which establishes a short at the bottom of layer 110 discussed in more detail below. Device 100 also comprises a trench 112 (FIG. 2) to isolate device 100 from the rest of the die.

In one embodiment, contacts 102, 104 and 104' are shallow n+S/D diffusions having a depth of about 0.2 μm and a width of about 2.5 μm. Contacts 102 and 104, and 102 and 104', are spaced apart respectively by about 2.5 μm in an embodiment. Isolation regions 106 and 106' are 1.3 μm-deep p-tubs spaced apart from contacts 104 and 104', respectively, by about 0.7 μm in an embodiment, while outer contacts 108 and 108' are n-CMOS wells having a depth of about 1 μm in an embodiment, spaced apart from isolation regions 106 and 106', respectively, by about 0.6 μm and from an end of epitaxial layer 110 by about 0.8 μm. The various dimensions, spacings and configurations are merely exemplary of an embodiment and can vary in other embodiments, as is discussed in more detail below.

Referring also to FIG. 2, a plurality of exemplary embodiments are depicted in which the size, number, configuration and/or other characteristics of contacts 102, 104, 104', 108 and 108' and isolation regions 106 and 106' varies. These and other variations provide different operating modes, depending on the number of operating modes (related to the number of contacts) and configurations of the contacts that affects the resistance. In FIG. 2A, device 200A is similar to device 100 in that it comprises contacts 102, 104, 104', 108 and 108' as well as isolation regions 106 and 106' respectively spaced apart in a similar manner. In FIG. 2B, contact 102 is differently sized. In FIG. 2C, contacts 102, 104 and 104' are similarly sized though smaller than in device 200a of FIG. 2A. In FIG. 2D, device 200d comprises additional center contacts 114, 116, 116', 118, 120 and 120'. In FIG. 2E, device 200e is similar to device 200c of FIG. 2C except that the configuration of isolation regions 106 and 106' has changed. In FIG. 2F, device 200f comprises a single center contact 102 and has a similar isolation region 106 and 106' configuration as that of device 200e in FIG. 2E.

In devices 100 and 200a-f, the overall resistance in each device depends on the mechanical stress affecting the device. Measuring the mechanical stress, however, is difficult, in part because it can depend on temperature. In embodiments, therefore, the device can be operated in multimode modes depending on coupling arrangements of the contacts. It is desired that a larger portion of the current flows in a vertical direction in one of the modes versus the other. Then, the resistances in the multiple modes can be compared, with temperature factored out because it is constant across the multiple modes. In an embodiment, a percentage change of resistance between at least two operating modes is determined according to $\Delta R/R$, which is equal to the piezo-coefficient times the mechanical stress affecting the device.

The piezo-coefficient is related to direction of current flow in the device, generally having horizontal and vertical components. Referring again to FIGS. 1 and 2A as well as FIG. 3A, when current is injected into one or more of the contacts of device 100 or 200a, current flows generally into and through epitaxial layer 110. The current flows both horizontally and vertically, with different ratios of horizontal and vertical components throughout epitaxial layer 110 providing an effective piezo-coefficient. In general herein, calculations are restricted to in-plane stress, ignoring vertical stress, which is a realistic assumption for real integrated circuit (IC) packages.

FIG. 3A relates to a first operating mode and the embodiment depicted in FIGS. 1 and 2A, though only one half, the right half as depicted on the page of FIG. 1, is shown in FIG. 3A. In this operating mode, center contacts 102, 104 and 104' are held at 1 V while outer contacts 108 and 108' are grounded. As can be seen in FIG. 3A, the current flows primarily from center contacts 102 and 104 vertically downward through epitaxial layer 110 to the buried layer, then outward in the low ohmic buried layer and upward to the outer contact 108. A portion of the current, however, is shunted directly from center contacts 102 and 104 to outer contact 108, as can be seen in layer 110 below isolation region 106. Further, the current lines flowing mainly vertically to the buried layer show some spreading, indicating both horizontal and vertical components. This blend of horizontal and vertical components leads to a mixing of respective piezo-coefficients. In FIG. 3A, and assuming the horizontal axis of device 100 is aligned to the [100] direction of the silicon crystal and the vertical axis to the [001], the resistance is equal to:

$$R = R_0\left(1 + \frac{43.83\%}{\text{GPa}} \cdot (\sigma_{11} + \sigma_{22}) - \frac{9.34\%}{\text{GPa}} \cdot (\sigma_{11} - \sigma_{22})\right)$$

where GPa is giga-Pascals and equal to $10^9$ N/m², with N being Newtons and m, meters.

In FIG. 3B, current flowlines in a second operating mode of device 100 are shown. In this operating mode, contact 104 (and contact 104', not depicted given that only the right symmetrical half of device 102 is shown in FIGS. 3A-D) is left floating, while contact 102 is held at 1 V and outer contact 108 (and 108', not depicted) is grounded. Compared with the current flowlines in FIG. 3A, the flowlines in FIG. 3B have a larger horizontal component, and more current is shunted from contact 104 to contact 108. The floating contact 104 (and 104') lead to a short circuiting effect. The smaller center contact 102 leads to more spreading of the current flowlines, also visible in FIG. 3B, which increases the ratio of horizontal components. It follows that the piezo-resistance approaches the lateral resistance, which has a smaller piezo-coefficient than the vertical resistance. The resistance for the operating mode of FIG. 3B can be expressed as:

$$R = R_0\left(1 + \frac{31.00\%}{\text{GPa}} \cdot (\sigma_{11} + \sigma_{22}) - \frac{22.14\%}{\text{GPa}} \cdot (\sigma_{11} - \sigma_{22})\right)$$

Current flowlines in device 100 in a third operating mode is depicted in FIG. 3C, in which contact 102 is floating, contact 104 (and 104') is at 1 V and contact 108 (and 108') is grounded. The piezo-resistive behavior can be expressed as:

$$R = R_0 \left( 1 + \frac{39.64\%}{\text{GPa}} \cdot (\sigma_{11} + \sigma_{22}) - \frac{13.54\%}{\text{GPa}} \cdot (\sigma_{11} - \sigma_{22}) \right)$$

A fourth operating mode of device 100 is depicted in FIG. 3D. In this operating mode, contacts 102 and 104 (and 104') are floating, contact 108' (not shown in FIG. 3D) is at 1 V and contact 108 is grounded. The piezo-resistance in this mode is:

$$R = R_0 \left( 1 + \frac{47.37\%}{\text{GPa}} \cdot (\sigma_{11} + \sigma_{22}) - \frac{5.46\%}{\text{GPa}} \cdot (\sigma_{11} - \sigma_{22}) \right)$$

In the four operating modes of FIGS. 3A-D, the piezo-drift of resistance values with respect to the sum of the in-plane stresses ranges from 47%/GPa to 31% GPa, differing by a factor of more than 1.5. Given the significant difference, these measurements can be used to extract the mechanical stress. As previously mentioned, this can be done in one embodiment by operating device 100 in at least two different operating modes and comparing the resistances measured in each. Even at zero stress, the resistances in different operating modes will not be identical, but this is unimportant in embodiments because the ratio of zero stress resistances shows a small spread due to layout and manufacturing tolerances. For coarse stress sensors, this spread may be neglected in embodiments, with a measured ratio compared with a nominal value obtained theoretically or by characterization of typical production lots. For more accurate stress sensors, the ratio can be measured, e.g., on wafer level prior to packaging, and the ratio then stored in on-chip memory, such as EEPROM, fuses or some other form. During operation in the field, the measured ratio can be compared with the stored ratio, with any deviation due to a stress difference.

So far, differences of normal stress components have been neglected. Assuming a second device rotated around [001] by 90 degrees, the horizontal access in FIGS. 3A-D would then correspond to [010] instead of [100]. The piezo-resistance for this device is obtained in an embodiment by exchanging $\sigma_{11}$ with $\sigma_{12}$. Thus, the sign of the difference term changes, so the differences terms can be canceled when two devices with perpendicular orientations in layout are used and connected in series or parallel, a so-called "L-layout," an embodiment of which is depicted in FIG. 4. In FIG. 4, device 400 depicts different mode series connections of devices 200f, though any device 100, 200a-f or some other appropriate stress sensor device can be used in other embodiments. The ratio of R1/R2 is indicative of mechanical stress in device 400.

As discussed above, temperature concerns fall away because a single device is used in two operating modes, and any temperature dependence cancels out in the ratio of resistance values. In an embodiment, this is achieved using constant voltage biasing, not constant current biasing, because the latter changes the potentials versus temperature and stress and therefore also the exact geometry of the active area due to modulation of space charges layers.

Embodiments discussed above can utilize n-buried layer technology, though other embodiments without such a layer can also be implemented. If there is no short at the bottom of epitaxial layer 110, different ratios of horizontal to vertical current flow can be achieved by varying the spacing between contacts. Referring to FIG. 5A, if current flows between two contacts C1 and C3 that are spaced apart by a distance greater than the depth of active volume 510, horizontal components will dominate vertical components. If the contacts are closer than the depth, such as for C1 and C2, the current flowlines take a semicircular path, with horizontal and vertical components closer to equal. Device 500 also comprises isolation trenches or cups 506.

Another view is shown in FIG. 5B. Device 500b comprises three contacts C1, C2 and C3 arranged in, in one embodiment, a low n-doped region 510. Contacts C1 and C2, and C2 and C3 are separated, respectively, by isolation trenches 506' and 506. A p-substrate 512 isolates an outer portion of device 500. Ratios of resistances between C2-C1 and C3-C1, as well as C2-C3 and C3-C1, are indicative of mechanical stress.

Another configuration, shown as device 500c, is depicted in FIG. 5C in which the configuration of contact C2 is altered. The same various ratios of resistance are available in device 500c as discussed above with respect to device 500b. Another embodiment is depicted in FIG. 5D, in which isolation trenches 506 and 506' are omitted.

In the embodiment of FIG. 5E in which contact C2 is small relative to contacts C1 and C3, the ratio of resistance between C2-C1 and C2-C3 is generally independent of mechanical stress. The ratio of resistance between C2-C1 and C3-C1 depends on stress. Because the distance of C3-C1 is larger than that between C2-C1, it would lead to a larger resistance between C3-C1 than between C2-C1, if all contacts C1, C2, C3 are the same size. If, for example, C2 is made smaller, the resistance of C2-C1 increases. Thus, it can be an advantage in embodiments to reduce the size of C2 so that at zero stress the resistance between C2-C1 is equal to the resistance between C3-C1.

Figure 5F:
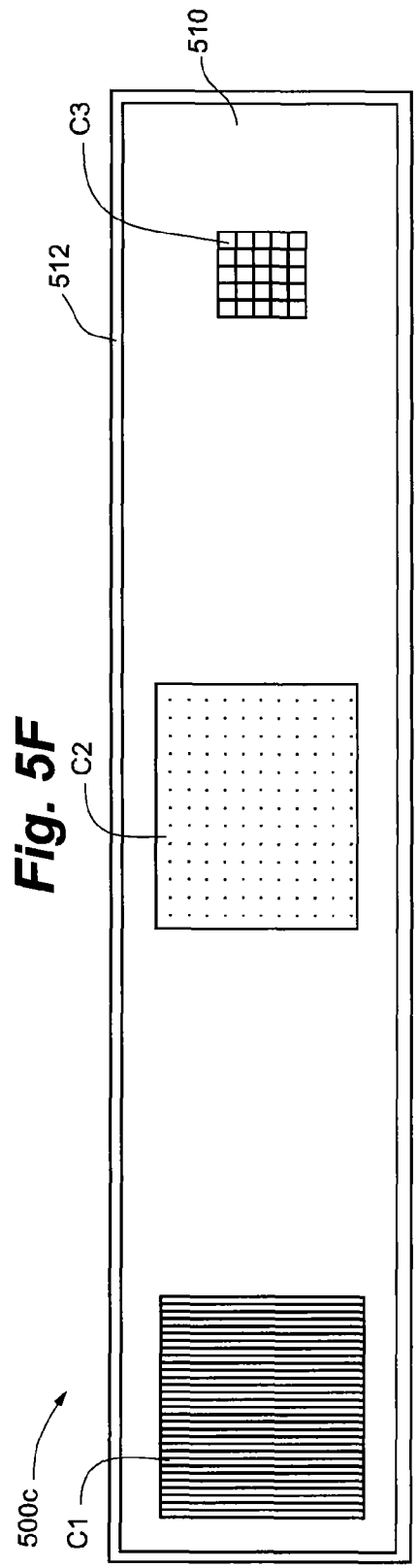
FIG. 5F is a top view block diagram of a stress sensor device according to an embodiment.

In FIG. 5F, the resistance between C1 and C2 is lower than that between C1-C3 or C2-C3, making this configuration less attractive. The ratio of resistances between C2-C1 and C3-C1 is indicative of mechanical stress, however.

Figure 5G:
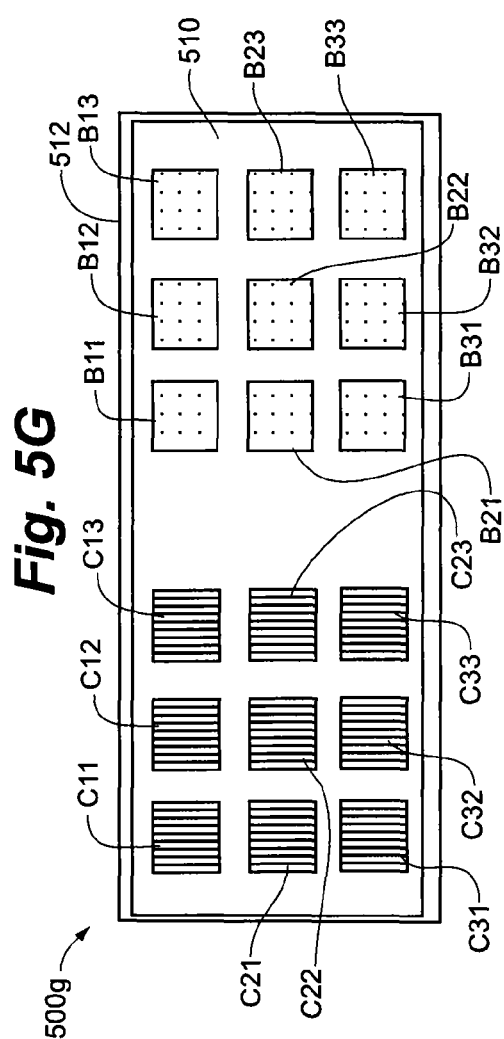
FIG. 5G is a top view block diagram of a stress sensor device according to an embodiment.

Another configuration is depicted in FIG. 5G. Device 500g of FIG. 5g has two blocks of contacts, C and B. Though generally depicted as having the same size and number of contacts, this need not be the case in other embodiments. A first resistance can be measured between C22 and B22, or any other pair of contacts. A second resistance can be measured between all C contacts, shorted via switches, and all B contacts, also shorted via switches. The ratio of both resistances is indicative of mechanical stress in device 500g.

FIG. 5H depicts a device 500h with rotational symmetry. The resistance between C2-C1 can be designed to be similar to the resistance between C3-C1. The ratio of resistances between C2-C1 and C3-C1 is indicative of mechanical stress, as is the ratio between C2-C1 and C2-C3. Sensitivity to mechanical stress is all the larger if C3 is large is C1 and C2 relatively smaller. In an embodiment, 510 is an n-doped epitaxial layer and 512 a p-doped isolation layer, as in other embodiments. An advantage of the embodiment of FIG. 5H is that an L-layout, such as is depicted in FIG. 4, is intrinsic, eliminating the need for a second device 500 to cancel the terms $\sigma_{11}$-$\sigma_{22}$ in the resistance.

Figure 6:
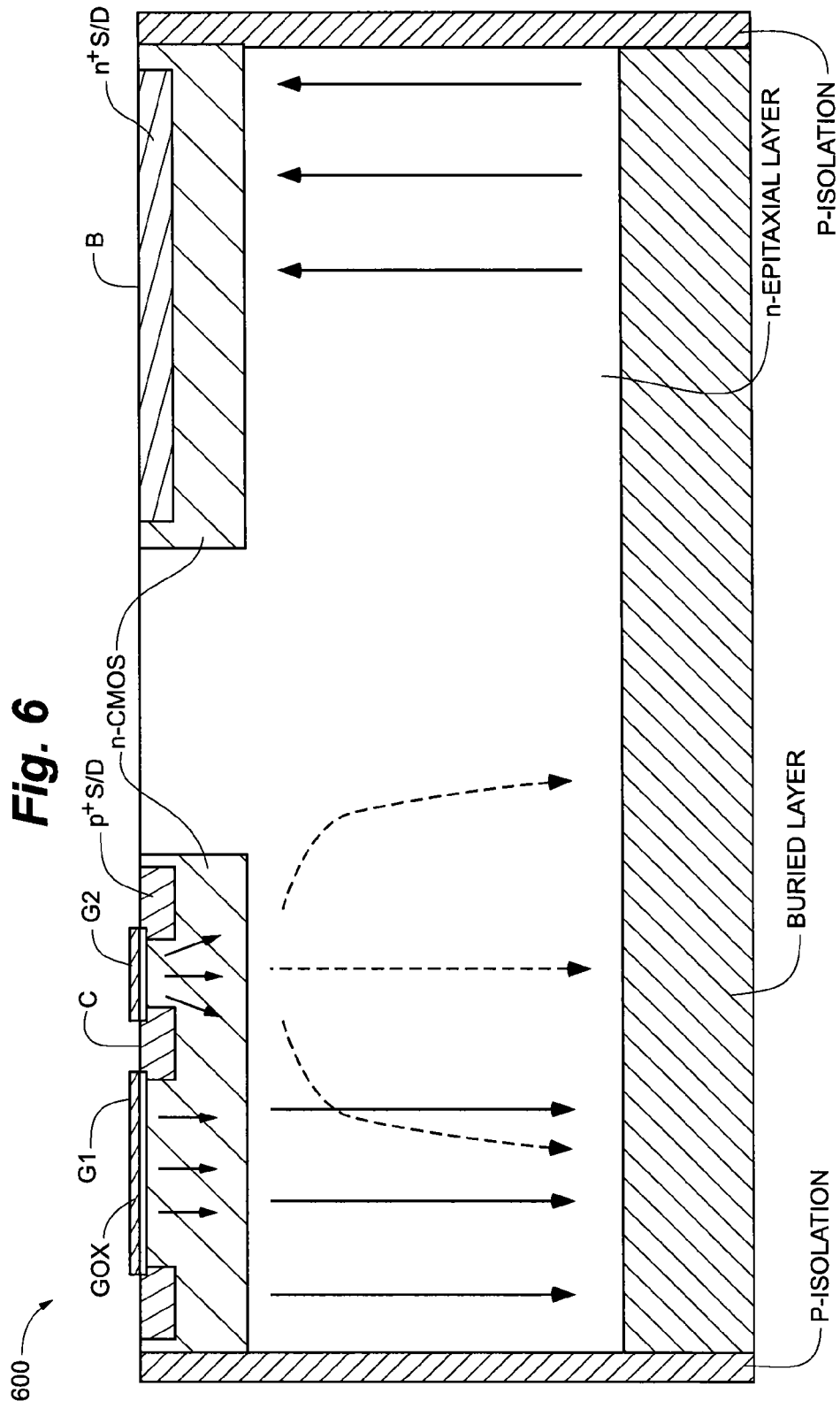
FIG. 6 is a side view cross-sectional block diagram of a stress sensor device according to an embodiment.

In various embodiments, the stress sensing devices comprises switches in order to couple and decouple the contacts to achieve differing operating modes. In an embodiment, such as the one depicted in FIG. 6, the switches can comprise MOS switches integrated into the stress sensing device. In device 600, current is supplied via contact C, which is coupled to a highly doped p Source/Drain diffusion, p+S/D. If high potentials are supplied to G1 and G2, no inversion channel can develop below these gates. If enough voltage is applied at C, the pn-junction between the p+S/D and the n-CMOS-well is forward biased, and current is injected into the n-epitaxial layer flowing downward to the buried layer, then up again at the right side, where an ohmic contact is applied at B via an n+S/D diffusion. By applying low potentials at G1 and/or G2, channels develop below the gates, and the current is spread out over a larger area of device 600. Thus, the current has more vertical portions, shown in solid arrows, and the resistance of device 600 has a larger piezo-coefficient in this operating mode. In an embodiment, the p+S/D diffusions at the left and right are omitted, though an advantage of these regions is that if G1 and G2 are off, the contacts have no short circuiting effect on the current because they are not conducting. A disadvantage is added complexity, a special device and the fact that there is always a forward diode voltage drop in addition to the piezo-resistance, which should be extracted.

In operation, embodiments of the invention can be used to monitor assembly line and processes and to detect changes or flaws therein. Additionally or alternatively, embodiments can be mounted in modules and used to read out resistance ratios as discussed in order to detect die cracks in overmolding. Other uses, configurations and implementations are also contemplated.

Various embodiments of systems, devices and methods have been described herein. These embodiments are given only by way of example and are not intended to limit the scope of the invention. It should be appreciated, moreover, that the various features of the embodiments that have been described may be combined in various ways to produce numerous additional embodiments. Moreover, while various materials, dimensions, shapes, implantation locations, etc. have been described for use with disclosed embodiments, others besides those disclosed may be utilized without exceeding the scope of the invention.

Persons of ordinary skill in the relevant arts will recognize that the invention may comprise fewer features than illustrated in any individual embodiment described above. The embodiments described herein are not meant to be an exhaustive presentation of the ways in which the various features of the invention may be combined. Accordingly, the embodiments are not mutually exclusive combinations of features; rather, the invention may comprise a combination of different individual features selected from different individual embodiments, as understood by persons of ordinary skill in the art.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims for the present invention, it is expressly intended that the provisions of Section 112, sixth paragraph of 35 U.S.C. are not to be invoked unless the specific terms "means for" or "step for" are recited in a claim.

The invention claimed is:

1. A stress sensing device comprising:
an active semiconductor layer; and
a plurality of contacts for the active semiconductor layer, the plurality of contacts spaced apart from one another, wherein the stress sensing device is configured to sense a mechanical stress acting on the stress sensing device from vertical components in the active semiconductor layer of currents applied to at least one of the plurality of contacts.

2. The sensor device of claim 1, further comprising a buried layer, wherein the plurality of contacts are arranged in a surface of the active semiconductor layer opposite the buried layer.

3. The sensor device of claim 2, wherein the vertical component flows from the at least one of the plurality of contacts into the active semiconductor layer toward the buried layer.

4. The sensor device of claim 2, wherein the buried layer comprises an n-type buried layer.

5. The sensor device of claim 1, wherein the active semiconductor layer comprises an epitaxial layer.

6. The sensor device of claim 5, wherein the epitaxial layer comprises an n-type doped layer.

7. The sensor device of claim 1, wherein the plurality of contacts comprise three contacts.

8. The sensor device Of claim 1, wherein adjacent ones of the plurality of contacts are separated from one another hr an isolation region.

9. The sensor device of claim 8, wherein the isolation region comprises a p-type doped isolation well.

10. The sensor device of claim 1, wherein the vertical component is related to at least one of a resistance of the sensor device and a temperature of the sensor device.

11. A stress sensing device comprising:
an active layer;
at least two contacts arranged in a first surface of the active layer; and
a buried layer coupled to a second surface of the active layer opposite the first surface,
wherein the at least two contacts, the active layer and the buried layer comprise n-type elements, and a mechanical stress acting on the stress sensing device is related to a portion of a current that flows in the active layer from at least one of the at least two contacts.

12. The stress sensing device of claim 11, wherein each of the at least two contacts comprise at least one or an (n+)-type Source/Drain diffusion or an n-type CMOS well.

13. The stress sensing device of claim 12, wherein the at least two contacts are spaced apart from one another by at least one p-type tub.

14. The stress sensing device of claim 11, wherein the active layer comprises an epitaxial layer.

15. The stress sensing device of claim 14, wherein the epitaxial layer comprises an n-type doped region.

16. The stress sensing device of claim 11, wherein the portion of a current is a vertical component of the current flowing from at least one of the at least two contacts into the active layer toward the buried layer.

17. The stress sensing device of claim 16, wherein the vertical component is related to a resistance of the stress sensing device.

18. The stress sensing device of claim 17, wherein the vertical component is related to a temperature of the stress sensing device.

19. A stress sensing device comprising:
an active semiconductor region; and
least three contracts for the active semiconductor region, the at least three contacts spaced apart from one another and configured to apply currents with vertical components to flow through the active semiconductor region, wherein the stress sensing device is configured to sense mechanical stress acting on the stress sensing device based on the applied currents.

20. The stress sensing device of claim 19, wherein the at least three contacts include a first contact, a second contact and a third contact, herein the first and second contacts are configured to apply a first current with a first current distribution in a first operating mode, and the second and third contacts are configured to apply a second current with a second.

* * * * *